United States Patent [19]
Frankoski et al.

[11] Patent Number: 5,614,056
[45] Date of Patent: Mar. 25, 1997

[54] APPARATUS FOR CHEMICALLY ETCHING SUBSTRATES

[75] Inventors: Edward J. Frankoski, Newark Valley; Jeffrey D. Jones, Endicott; Robert H. Katyl, Vestal, all of N.Y.; Lyn B. Ratcliff, Burbank, S. Dak.

[73] Assignee: International Business Machines Corporation, Armonk, N.Y.

[21] Appl. No.: 469,988

[22] Filed: Jun. 6, 1995

Related U.S. Application Data

[62] Division of Ser. No. 206,308, Mar. 4, 1994.

[51] Int. Cl.[6] .................................. C23F 1/02; B08B 3/00
[52] U.S. Cl. ...................... 156/345; 216/92; 134/64 R; 134/122 R; 134/199
[58] Field of Search .................................. 156/345, 640.1; 216/92; 134/64 R, 122 R, 198, 199

[56] References Cited

U.S. PATENT DOCUMENTS

| | | | |
|---|---|---|---|
| 4,917,758 | 4/1990 | Ishizuka et al. | 216/106 |
| 5,063,950 | 11/1991 | Kallweit et al. | 134/64 R |
| 5,188,135 | 2/1993 | Neumann et al. | 134/64 R |
| 5,289,639 | 3/1994 | Bard et al. | 134/64 R |
| 5,435,885 | 7/1995 | Jones et al. | 156/345 X |

*Primary Examiner*—Thi Dang
*Attorney, Agent, or Firm*—Bernard Tiegerman

[57] ABSTRACT

An apparatus for chemically etching the copper foil of a copper foil-clad substrate are disclosed. Significantly, this apparatus includes fluid jet injectors which serve to produce jets of chemical etchant. These fluid jet injectors are arranged so as to simultaneously achieve a relatively high etch rate and a relatively high etch uniformity.

6 Claims, 3 Drawing Sheets

APPARATUS FOR CHEMICALLY ETCHING SUBSTRATES

This is a divisional of copending application Ser. No. 08/206,308 filed on Mar. 4, 1994.

BACKGROUND OF THE INVENTION

1. Field of the Invention

The invention relates generally to an apparatus, and a corresponding method, for chemically etching copper foil-clad substrates, such as copper foil-clad printed circuit board substrates.

2. Description of the Related Art

Thin conductive metal foils, such as thin copper foils, play an important role in the fabrication of printed wiring circuits on printed circuit boards. That is, such printed wiring circuits are typically formed by attaching, e.g., laminating, a thin copper foil to a printed circuit board substrate. The thin copper foil is subsequently, for example, selectively etched to form the desired circuit pattern. This is accomplished by initially forming a patterned photoresist on the copper foil and then etching the copper foil while using the patterned photoresist as an etch mask. Alternatively, a circuit pattern is formed by selectively depositing additional copper onto the copper foil. In this alternative, a patterned photoresist is also initially formed on the copper foil. Then, additional copper is selectively deposited, e.g., electroplated, onto the copper foil, portions of which copper foil and/or deposited copper are subsequently etched away, and thus sacrificed.

Regardless of whether selective etching or selective deposition is used, it is often important that the above-described copper foil be as thin as possible. For example, if selective etching is used, then the thinner the copper foil, the more closely the etched copper foil will match the patterned photoresist. On the other hand, if selective deposition is used, where the thin copper foil is ultimately etched away, it is important that the etching of the copper foil not damage or degrade the corresponding circuit pattern, which is more readily achievable if the copper foil is truly very thin.

Currently, copper foils having thicknesses as small as 12 micrometers are used in forming printed wiring circuits. However, there is a strong desire in the printed circuit board industry to use even thinner copper foils, e.g., copper foils having thicknesses of 9 micrometers, 5 micrometers or even 3 micrometers.

Various attempts have been made to form copper foils having thicknesses equal to or less than 9 micrometers on printed circuit board substrates. In several such attempts, the copper was sputtered directly onto the substrate. Unfortunately, the heat of the sputtering process was so great as to destroy, deform or undesirably alter the corresponding substrates.

Other attempts to form very thin copper foils have involved chemically treating substrates and then chemically depositing very thin copper foils onto the treated substrates. These attempts proved to be very sensitive to contamination, which led to pin hole voids in the deposited copper. Such pin hole voids are undesirable because they can and do degrade the electrical performance of the corresponding printed circuit board.

Significantly, a new method for forming a very thin copper foil on a substrate is described in U.S. Pat. No. 4,917,758 which issued to K. Ishizuka et al on Apr. 17, 1990. Here, a substrate bearing a relatively thick copper foil is chemically etched with a spray-type etching machine in order to thin the relatively thick copper foil. While the reported variation of the thickness of the copper foil remaining after the etching is within +/−2.0 micrometers, the etch rate is less than or equal to 0.3 micrometers per second. Such low etch rates require corresponding etch times which are much too long for many commercial applications.

Thus, those engaged in the development of printed circuit boards have sought, thus far without success, apparatuses and methods for effectively forming very thin copper foils within commercially viable time periods.

SUMMARY OF THE INVENTION

The invention involves an apparatus, and a corresponding method, for chemically etching at least a region of a copper foil overlying a substrate, e.g., a printed circuit board substrate, at an etch rate which is greater than 0.3 micrometers per second, or equal to or greater than 0.5 micrometers per second, and even as high as about 3 micrometers per second. (For purposes of the invention, etch rate is defined to be the average thickness of copper etched divided by the total etching time.) Consequently, the corresponding etch times are definitely commercially viable and, indeed, commercially attractive. Moreover, the chemical etching is sufficiently uniform so that at any point, the variation in the thickness of copper etched is within 10 percent, or even within 6 percent, of the average thickness of copper etched over the entire copper foil region. Thus, for example, if the initial average thickness of the copper foil region is 18 micrometers and the initial thickness variability is ignored, and if the thickness of the copper foil region is to be reduced by, for example, 15 micrometers, to produce a desired final average thickness of 3 micrometers, then the corresponding variation in the thickness of the resulting copper foil region will be within 1.5 micrometers (10 percent of 15 micrometers) of the desired final average thickness. Similarly, if the initial average thickness of the copper foil region is 13 micrometers and the initial thickness variability is ignored, and if the thickness of the copper foil region is to be reduced by, for example, 10 micrometers, to produce a desired final average thickness of 3 micrometers, then the corresponding variation in the thickness of the resulting copper foil region will be within 1 micrometer (10 percent of 10 micrometers) of the desired final average thickness.

Significantly, the inventive apparatus includes a plurality of fluid jet injectors, each of diameter D, which penetrate a surface of the apparatus. Rollers, positioned at the entrance edge and exit edge of the apparatus surface, serve to transport a copper foil-clad substrate over this surface, along a transport direction which is parallel to an imaginary axis associated with the apparatus surface, extending from the entrance edge to the exit edge. As the copper foil-clad substrate moves over the apparatus surface, jets of chemical etchant emitted by the fluid jet injectors impinge upon the substrate, chemically etching the copper foil.

To achieve the above-described etching characteristics, the fluid jet injectors are arranged so that if one were to draw an imaginary line along the apparatus surface in a direction which is parallel to the substrate transport direction, extending from the entrance edge to the exit edge and intersecting the center of at least one fluid jet injector, then the total number of fluid jet injector centers intersected by this imaginary line would be the same as that intersected by any other such imaginary line. In addition, if the distance between any two such adjacent imaginary lines is denoted by S1, then the ratio S1/D should be greater than 0 but less than or equal to about 10, and preferably less than or equal to about 1.3. Moreover, if S2 denotes the distance between any two adjacent fluid jet injectors, then S2/D should be greater than about 2 but less than or equal to about 20, and preferably less than or equal to about 12. It must be emphasized that it is by virtue of this arrangement of fluid jet injectors that the above-described combination of relatively high etch rate and substantially uniform etching is achieved.

It should be noted that the above-described arrangement of fluid jet injectors is based upon the finding that when a jet of chemical etchant impinges upon copper foil, the chemical etchant will etch the copper at an etch rate greater than 0.3 micrometers per second (using the Reynolds numbers, described below) over a circular area having a radial extent of about 10*D. Therefore, in the inventive apparatus, the ratio S2/D is required to be less than or equal to about 20 to ensure that after impingement, any two adjacent fluid jets will overlap each other after spreading out radially no more than about 10*D. In addition, it has been found that when one of the jets of chemical etchant impinges upon a moving copper foil, that the variation in the thickness of the copper etched is within 10 percent of the average thickness of the copper etched only over an area having a width of about 10*D. Therefore, to achieve such a 10 percent uniformity throughout the region of copper foil to be etched, the ratio S1/D is required to be less than or equal to about 10. Moreover, because each of the above-described imaginary lines intersects the same number of fluid jet injector centers, each longitudinal strip of copper foil etched by chemical etchant jets during the passage of the substrate over the apparatus surface necessarily undergoes etching by the same number of chemical etchant jets, over the same total etching time. Consequently, each such longitudinal strip undergoes substantially the same integrated etch rate (integrated over the same total etching time), and therefore substantially the same total amount of etching, resulting in etched copper foil having the relatively low thickness variation, described above.

BRIEF DESCRIPTION OF THE DRAWINGS

The invention is described with reference to the accompanying drawings, wherein.

DETAILED DESCRIPTION OF THE PREFERRED EMBODIMENT(S)

The invention involves an apparatus, and a corresponding method, for chemically etching at least a region of a copper foil overlying a substrate, such as a printed circuit board substrate. Significantly, the etch rate achievable with the inventive apparatus is greater than 0.3 micrometers per second, or equal to or greater than 0.5 micrometers per second, and is even as high as about 3 micrometers per second. In addition, the etching is so uniform that the variation in the thickness of copper etched is within 10 percent, or even within 6 percent, of the average thickness of copper etched over the entire foil region. As a consequence, the variation in the thickness of the resulting etched copper foil region is within 1.5 micrometers, or even within 1 micrometer, of a desired final average thickness (assuming no initial thickness variability). (Obviously, the total thickness varialbility is the sum of the initial thickness variability and any additional thickness variability due to the etching.)

Figure 1:
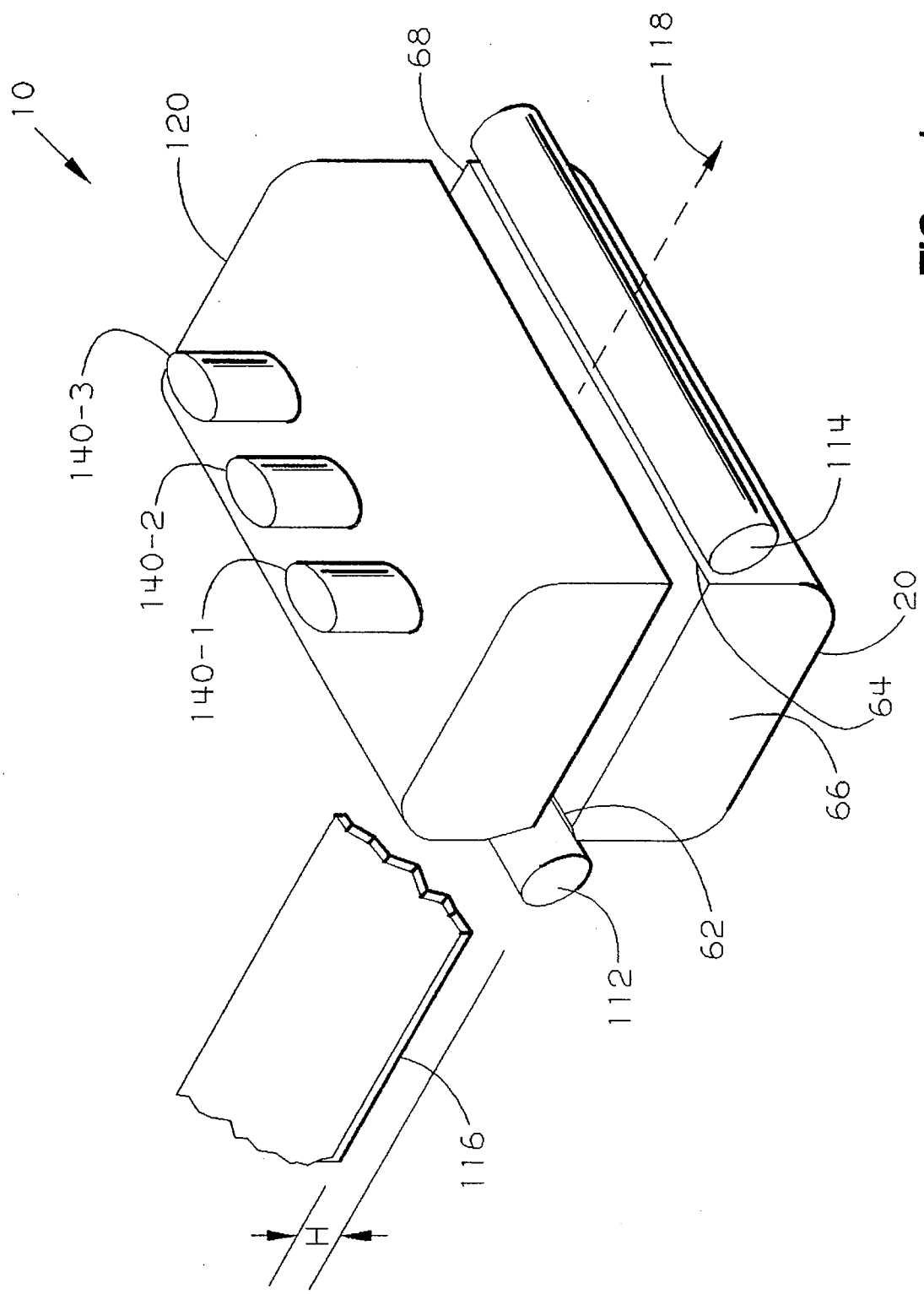
FIG. 1 is a perspective view of a preferred embodiment of the inventive apparatus.
Figure 2:
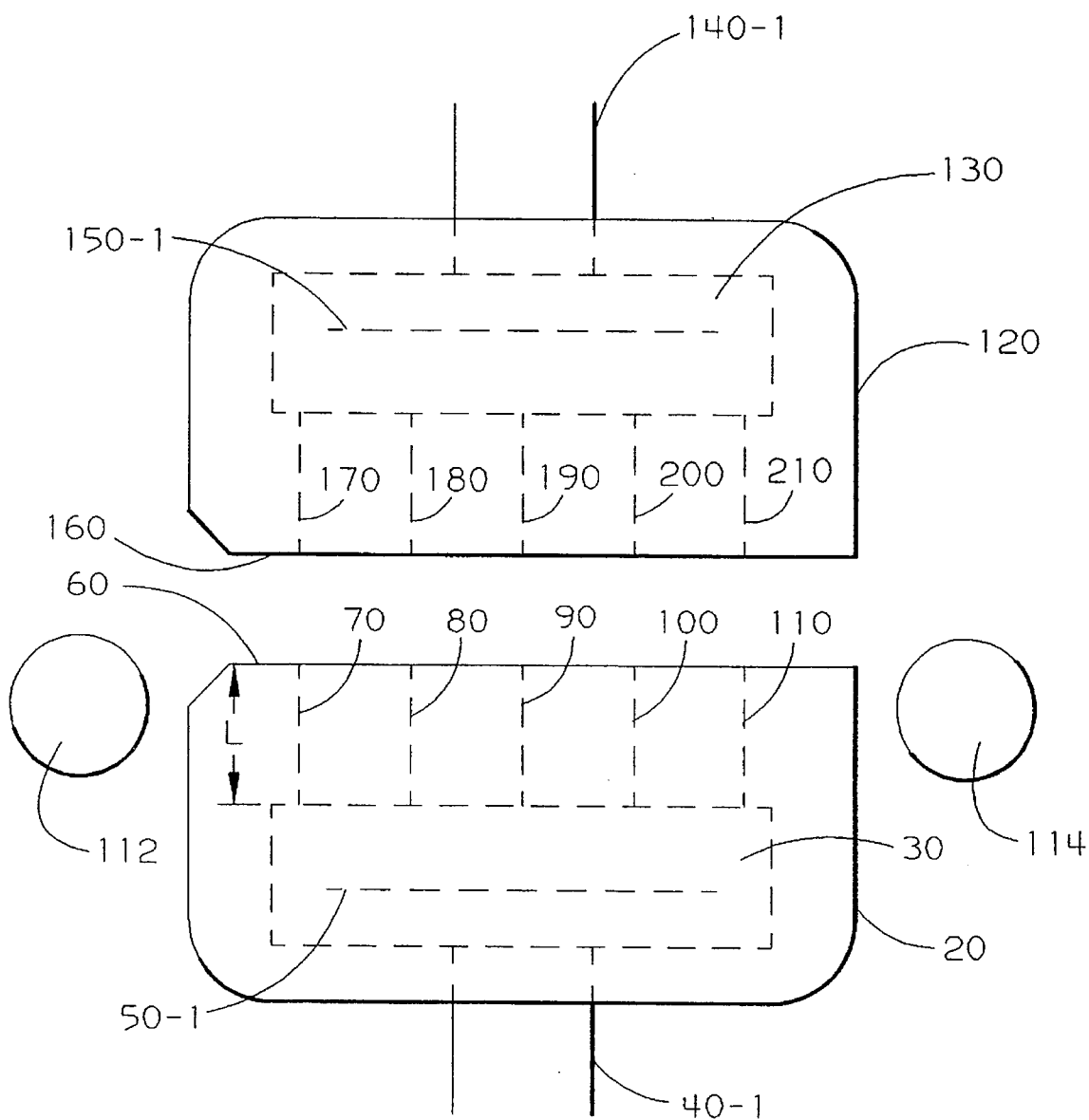
FIG. 2 is a vertical cross-sectional view of the preferred embodiment.

With reference to FIGS. 1 and 2, a first embodiment of the inventive apparatus 10 includes at least one plenum housing 20 made, for example, of polycarbonate. This plenum housing 20 contains a plenum chamber 30 into which a chemical etchant is fed under pressure via three feed tubes 40-1, 40-2 and 40-3 (only one of which is shown in FIG. 2).

The plenum chamber 30 includes three deflector plates 50-1, 50-2 and 50-3, aligned with the three feed tubes 40-1, 40-2 and 40-3, which serve to uniformly disperse chemical etchant toward, and into, five rows 70, 80, 90, 100 and 110 of spaced-apart, drilled holes extending from the plenum chamber 30 to the surface 60 of the plenum housing 20. Each such hole serves as a fluid jet injector, with the corresponding fluid jet being a jet of chemical etchant.

As shown more clearly in FIG. 1, the inventive apparatus 10 also includes rollers 112 and 114 which serve to transport a copper foil-clad substrate 116, e.g., a copper foil-clad printed circuit board substrate, at a distance, H, from the surface 60, from an entrance edge 62 to an exit edge 64 of the surface 60. This transport of the substrate 116 occurs along a transport direction which is parallel to an imaginary axis 118 associated with the surface 60, which axis is oriented perpendicularly to the entrance and exit edges 62 and 64, and extends from the entrance edge 62 to the exit edge 64, and beyond.

It should be noted that spent chemical etchant flows over the entrance and exit edges 62 and 64, as well as over the sides 66 and 68, of surface 60, into a sump (not shown) positioned below the apparatus 10. Thus, the entrance and exit edges 62 and 64, as well as the sides 66 and 68, serve as the drains of the apparatus 10.

Figure 3:
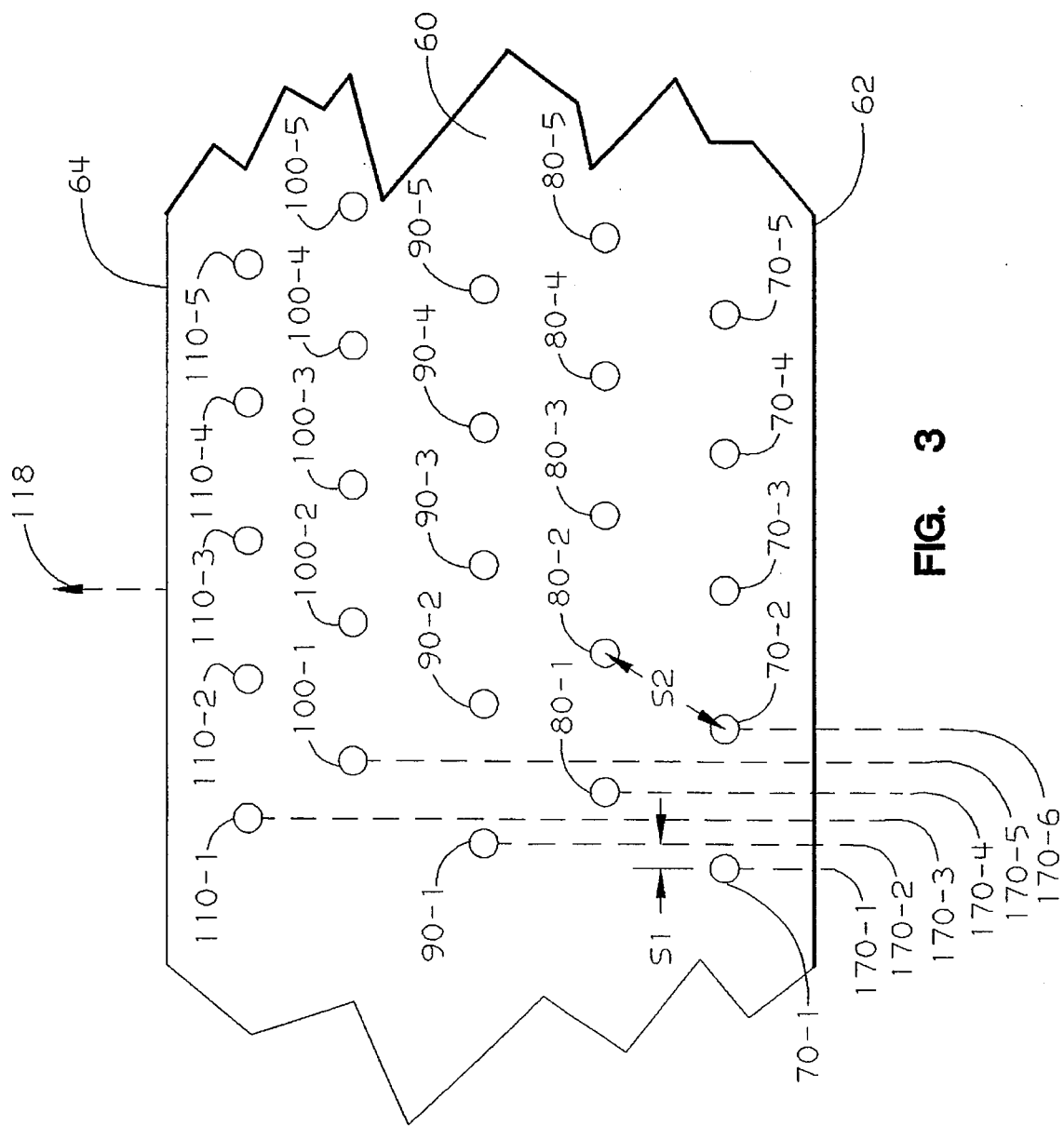
FIG. 3 is a top view of the pattern of fluid jet injectors associated with the preferred embodiment.

With reference now to FIG. 3, the five rows 70, 80, 90, 100 and 110 of fluid jet injectors are preferably all parallel to one another and aligned perpendicularly with respect to the axis 118. In addition, the fluid jet injectors in each of the rows are preferably equidistantly spaced, and the fluid jet injectors in any one row are also preferably shifted relative to the fluid jet injectors in an adjacent row so that if the former row were to be projected onto the latter row, the fluid jet injectors in the former row would be interdigitated with the fluid jet injectors in the latter row. Moreover, each of the fluid jet injectors is of equal diameter, D, which ranges from about 5 mils (0.005 inches) to about 250 mils (0.250 inches), and is preferably about 40 mils (0.040 inches). Fluid jet injectors having diameters smaller than about 5 mils are undesirable because they are difficult to fabricate and difficult to keep clean. On the other hand, fluid jet injectors having diameters greater than about 250 mils are undesirable because they require an undesirably large amount of pump flow to produce chemical etchant jets.

With reference again to FIG. 2, the drilled holes which constitute the fluid jet injectors are preferably all of equal length, L. In this regard, the ratio L/D ranges from about 1 to about 40. Ratios less than about 1 are undesirable because they result in poorly developed chemical etchant jets. Ratios greater than about 40 are undesirable because they require an undesirably large amount of pump pressure to produce chemical etchant jets.

As shown in FIG. 1, the rollers 112 and 114 serve to transport the copper foil-clad substrate 116 over the surface 60 of the apparatus 10 at a height, H, above the surface 60. In this regard, the ratio H/D ranges from about 0.3 to about 12. Ratios smaller than about 0.3 are undesirable because they result in undesirably little drainage of the spent chemical etchant. On the other hand, ratios greater than about 12 are undesirable because they result in an undesirably large loss of momentum of the chemical etchant jets before the jets impinge upon the substrate 116.

With reference again to FIG. 2, because the fluid jet injectors are preferably all of equal diameter, D, and are all connected to the same plenum chamber 30, the chemical etchant supplied to each of the fluid jet injectors is necessarily essentially the same, and the speed of the chemical etchant jets emanating from the fluid jet injectors is necessarily essentially also the same. If the kinematic viscosity of the supplied chemical etchant is denoted by nu and the speed of the chemical etchant jets at the fluid jet injectors is denoted by V, then the Reynolds numbers associated with each of the chemical etchant jets, defined as the ratio V*D/nu, preferably ranges from about 1,000 to about 15,000. Reynolds numbers less than about 1,000 are undesirable because they result in undesirably low etch rates, i.e., etch rates equal to or less than 0.3 micrometers per second. While etch rates increase with increasing Reynolds numbers, Reynolds numbers greater than about 15,000 are undesirable because they require an undesirably large amount of pump power to achieve.

In connection with the above, it should be noted that chemical etchants which readily etch copper and have kinematic viscosities which permit ready attainment of the above-mentioned Reynolds numbers include ferric chloride, hydrogen peroxide and sodium persulfate.

Significantly, as shown in FIG. 3, the fluid jet injectors of the rows 70, 80, 90, 100 and 110 are arranged so that if one were to draw an imaginary line, e.g., the imaginary line 170-1, along the apparatus surface 60 in a direction which is parallel to the substrate transport direction, extending from the entrance edge 62 to the exit edge 64 and intersecting the center of at least one fluid jet injector, e.g., injector 70-1, then the total number of fluid jet injector centers intersected by this imaginary line would be the same as that intersected by any other such imaginary line. Thus, for the pattern of fluid jet injectors depicted in FIG. 3, the total number of fluid jet injector centers intersected by, for example, the imaginary line 170-1 is only one, as is the case with any other such imaginary line, such as lines 170-2, 170-3, 170-4, etc. (Of course, patterns of fluid jet injectors where the total number of intersections is greater than one are also useful. It is believed that such patterns of fluid jet injectors may require drain holes interspersed among the fluid jet injectors.) In addition, if the distance between any two such adjacent imaginary lines, e.g., the distance between imaginary lines 170-1 and 170-2, is denoted by S1, then the ratio S1/D should be greater than 0 but less than or equal to about 10, preferably less than or equal to about 1.3. Moreover, if the distance between any two adjacent fluid jet injectors, e.g., the distance between fluid jet injectors 70-2 and 80-2, is denoted by S2, then the ratio S2/D should be greater than about 2, to avoid loss of structural integrity, but less than or equal to about 20, and preferably less than or equal to about 12.

Provided the above requirements are adhered to, the inventive apparatus readily permits one to chemically etch at least a region of the copper foil overlying the substrate 116 at an etch rate greater than 0.3 micrometers per second, or equal to or greater than 0.5 micrometers per second, and even as high as about 3 micrometers per second, while achieving a relatively high etching uniformity. That is, provided S2/D is less than or equal to or about 20, then the pattern of fluid jet injectors depicted in FIG. 3 readily permits one to etch copper foil at an etch rate greater than 0.3 micrometers per second. In addition, if S2/D is less than or equal to about 12, then an etch rate equal to or greater than 0.5 micrometers per second is readily achieved. Moreover, further reducing this ratio results in higher etch rates, with the etch rate even becoming as high as about 3 micrometers per second. In addition, provided S1/D is less than or equal to about 10, then the variation in the thickness of the etched copper will be less than or equal to 10 percent of the average thickness of copper etched over the copper foil region subjected to etching. If this ratio is reduced to about 1.3 or less, then the corresponding thickness variation drops to 6 percent or less.

As noted earlier, the inventive arrangement of fluid jet injectors is based upon the finding that when one of the jets of chemical etchant impinges upon copper foil, the chemical etchant will only etch the copper at an etch rate greater than 0.3 micrometers per second (using the Reynolds numbers discussed above) over a circular area having a radial extent of about 10*D. Even higher etching rates are achieved if the radial extent is about 6*D or less. Therefore, in the inventive apparatus, the ratio S2/D is required to be less than or equal to about 20, and preferably less than or equal to about 12, to ensure that after impingement, any two adjacent fluid jets will overlap each other after spreading out radially no more than about 10*D, and preferably no more than about 6*D. In addition, it has been found that when a jet of chemical etchant impinges upon a moving copper foil, that the variation in the thickness of the copper etched is within 10 percent of the average thickness of the copper etched only over an area having a width of about 10*D. Moreover, a thickness variation of 6 percent or less is achieved over an area having a width of about 1.3*D. Therefore, to achieve such a 10 percent, or 6 percent or less, thickness variation, the ratio S1/D is required to be less than or equal to about 10, and preferably less than or equal to about 1.3.

If the substrate 140 includes copper foils on its upper and lower surfaces, and the copper foils on both these surfaces are to be chemically etched, then the preferred embodiment of the inventive apparatus 10 preferably includes a second plenum housing 120, as depicted in FIG. 1. This second plenum housing 120 contains a plenum chamber 130 into which fluid is fed under pressure via three feed tubes 140-1, 140-2 and 140-3. The plenum chamber 130 includes three deflector plates 150-1, 150-2 and 150-3, aligned with the three feed tubes 140-1, 140-2 and 140-3, which serve to uniformly disperse chemical etchant toward, and into, five rows 170, 180, 190, 200 and 210 of spaced-apart, drilled holes extending from the plenum chamber 130 to the surface 160 of the plenum housing 120. Each such hole serves as a fluid jet injector, with the corresponding fluid jet being a jet of chemical etchant. The rows of fluid jet injectors 170, 180, 190, 200 and 210 are arranged in the same manner as the rows of fluid jet injectors 70, 80, 90, 100 and 110.

Among other applications, the inventive apparatus is useful in connection with the formation of a circuit pattern on a printed circuit board substrate. That is, such a circuit pattern is readily fabricated by laminating a relatively thick copper foil, i.e., a copper foil having an initial average thickness greater than 9 micrometers, to the upper surface of the printed circuit board substrate, using conventional techniques. One such commercially available, relatively thick copper foil has an initial average thickness of about 18 micrometers, while another commercially available, relatively thick copper foil has an initial average thickness of about 13 micrometers.

After the lamination step, at least a region, or all, of the relatively thick copper foil is chemically etched with the inventive apparatus 10. As discussed above, this means that the relatively thick copper foil will be etched at an etch rate which is greater than 0.3 micrometers per second, or equal to or greater than 0.5 micrometers per second, and even as high as about 3 micrometers per second. In addition, the variation in the thickness of copper etched at any point will be within 10 percent of the average thickness of copper etched over the copper foil region.

Preferably, the relatively thick copper foil is chemically etched to have a final average thickness which is less than or equal to about 9 micrometers but greater than or equal to about 3 micrometers. Useful final average thicknesses are, for example, 9 micrometers, 5 micrometers and 3 micrometers. As noted above, the variation in the thickness of copper etched at any point will be within 10 percent of the average thickness of copper etched over the copper foil region. Therefore, if the initial average thickness of the relatively thick copper foil is 18 micrometers (and is assumed to have no initial thickness variability) and the thickness of the copper foil region is to be reduced by, for example, 9 micrometers, to produce a desired final average thickness of 9 micrometers, then the corresponding variation in the thickness of the resulting copper foil region will be within 0.9 micrometers (10 percent of 9 micrometers) of the desired final average thickness. On the other hand, if the thickness of the copper foil region is to be reduced by 13 micrometers, to produce a desired final average thickness of 5 micrometers, then the corresponding variation in the thickness of the resulting copper foil region will be within 1.3 micrometers (10 percent of 13 micrometers) of the desired final average thickness. Further, if the thickness of the copper foil region is to be reduced by 15 micrometers, to produce a desired final average thickness of 3 micrometers, then the corresponding variation in the thickness of the resulting copper foil region will be within 1.5 micrometers (10 percent of 15 micrometers) of the desired final average thickness.

If the initial average thickness of the relatively thick copper foil is 13 micrometers (and is assumed to have no initial thickness variability), and the thickness of the copper foil region is to be reduced by, respectively, 4 micrometers (to achieve a desired final average thickness of 9 micrometers), 8 micrometers (to achieve a desired final average thickness of 5 micrometers) and 10 micrometers (to achieve a desired final average thickness of 3 micrometers), then the corresponding variation in the thickness of the resulting copper foil region will be, respectively, 0.4 micrometers, 0.8 micrometers and 1 micrometer.

After the completion of the above-described etching, the resulting copper foil is then processed using, for example, conventional subtractive or additive techniques, to produce the desired circuit pattern.

EXAMPLE 1

A relatively thick copper foil was laminated to a printed circuit board substrate, using conventional techniques. The dimensions of the substrate were 18 inches by 24 inches by 0.060 inches. The thickness of the copper foil was measured to be 13+/−0.36 micrometers, using a 4-point probe which had been calibrated using ½ ounce and 2 ounce copper foil laminated to an epoxy-glass substrate.

Using the apparatus depicted in the lower halves of FIGS. 1 and 2, and in FIG. 3, the entire copper foil of the above-described, copper foil-clad substrate was chemically etched. The chemical etchant was an aqueous solution of cuptic chloride, in which the concentration of cuptic chloride was 190 grams per liter. This aqueous solution also included a sufficient amount of hydrochloric acid to form a corresponding 1 molar solution. In connection with the apparatus, the diameter, D, of each of the fluid jet injectors was 40 mils (0.040 inches). The corresponding ratio of L/D was 6.25. In addition, the copper foil-clad substrate was transported over the surface of the apparatus at a height, H, of 0.050 inches and therefore the ratio H/D was 1.25. Moreover, the copper foil-clad substrate was transported at a speed of 20 inches per minute.

In connection with the arrangement of fluid jet injectors depicted in FIG. 3, the ratio S2/D employed was 6.25, while the ratio S1/D employed was 1.25. The Reynolds number associated with the corresponding chemical etchant jets was 1,750.

The resulting thickness of the etched copper foil was 3.0+/−0.46 micrometers, as measured with the 4-point probe. In addition, the corresponding etch rate (defined as average thickness of copper etched divided by total etch time) was 0.36 micrometers per second.

EXAMPLE 2

A relatively thick copper foil was laminated to a printed circuit board substrate, using conventional techniques. The dimensions of the substrate were 3 inches by 3 inches by 0.060 inches. The thickness of the foil was measured to be 18+/−0.2 microns, by examining cross-sections of the foil under a microscope.

Using an apparatus similar to that depicted in the lower halves of FIGS. 1 and 2, and in FIG. 3, a 1 inch-square portion of the copper foil surface of the above-described, copper foil-clad substrate was chemically etched. The chemical etchant was an aqueous solution of 190 grams per liter cuprio chloride and 3 molar hydrochloric acid, at 130 degrees Fahrenheit. In connection with the apparatus, the diameter, D, of each of the fluid jet injectors was 20 mils (0.020 inches). The corresponding ratio of L/D was 5.0. In addition, the copper foil-clad substrate was transported over the surface of the apparatus at a height, H, of 0.020 inches and therefore the ratio H/D was 1.0. Moreover, the copper foil-clad substrate was transported at a speed of 60 inches per minute.

In connection with the arrangement of fluid jet injectors depicted in FIG. 3, the ratio S2/D employed was 2.0, while the ratio S1/D employed was 1.0. The Reynolds number associated with the corresponding chemical etchant jets was 11,532.

The etch rate was 2.6 microns/second, as determined by the initial thickness and the time to completely etch through the one-inch-square region of copper foil. The variability in etched thickness at breakthrough was within +/−5 percent of the average, as determined by the time required for the lowest region of copper to completely etch away vs. that required for the thickest region to etch away.

While the invention has been particularly shown and described with reference to preferred embodiments thereof, it will be understood by those skilled in the art that various changes in form and details may be made therein without departing from the spirit and scope of the invention.

We claim:

1. Apparatus, comprising:
   at least a first surface, of finite dimensions, including an entrance edge and an exit edge and characterized by an axis extending from said entrance edge to said exit edge;

means for transporting a substrate over said surface at a distance, H, from said surface, from said entrance edge to said exit edge along a transport direction which is parallel to said axis, Characterized In That said apparatus further comprises a plurality of spaced-apart fluid jet injectors, each characterized by a diameter, D, and each capable of producing a fluid jet which impinges upon said substrate, said plurality of fluid jet injectors being arranged so that an imaginary line drawn along said surface in a direction which is parallel to said transport direction, which extends from said entrance edge to said exit edge, and which intersects the center of at least one fluid jet injector, intersects the same total number of fluid jet injector centers as any other such imaginary line drawn along said surface in a direction which is parallel to said transport direction, which extends from said entrance edge to said exit edge, and which intersects the center of at least one fluid jet injector, any two such adjacent imaginary lines being spaced apart by a distance S1, where S1/D is greater than 0 but less than or equal to about 10.

2. The apparatus of claim 1, wherein any two adjacent fluid jet injectors from among said plurality are separated by a distance S2, where S2/D is equal to or greater than about 2 but less than or equal to about 20.

3. The apparatus of claim 1, wherein S1/D is greater than 0 but less than or equal to about 1.3.

4. The apparatus of claim 2, wherein S2/D is equal to or greater than about 2 but less than or equal to about 12.

5. The apparatus of claim 1, wherein each of said fluid jets is characterized by a fluid speed, V, at said fluid jet injectors, and the fluid of said fluid jets is characterized by a kinematic viscosity, nu, and wherein a Reynolds number associated with each of said fluid jets, defined as the ratio V*D/nu, ranges from about 1000 to about 15,000.

6. The apparatus of claim 1, wherein the ratio H/D ranges from about 0.3 to about 12.

* * * * *